United States Patent
Komiya et al.

(10) Patent No.: US 7,578,054 B2
(45) Date of Patent: Aug. 25, 2009

(54) LINEAR DRIVING MECHANISM FOR ELECTRONIC COMPONENT MOUNTING APPARATUS

(75) Inventors: Takahiro Komiya, Fukuoka (JP); Kazuhide Nagao, Fukuoka (JP); Takuya Tsutsumi, Ogoori (JP)

(73) Assignee: Panasonic Corporation, Osaka (JP)

( * ) Notice: Subject to any disclaimer, the term of this patent is extended or adjusted under 35 U.S.C. 154(b) by 461 days.

(21) Appl. No.: 11/112,773

(22) Filed: Apr. 22, 2005

(65) Prior Publication Data

US 2005/0257638 A1 Nov. 24, 2005

(30) Foreign Application Priority Data

Apr. 23, 2004 (JP) .................. P. 2004-127842

(51) Int. Cl.
*B23P 19/00* (2006.01)

(52) U.S. Cl. .............. 29/740; 29/719; 29/720; 29/739; 29/741; 414/627; 294/64.1

(58) Field of Classification Search ........... 29/596–598, 29/729, 732–737; 310/12–14, 17, 20; 74/490.01; 414/749.1, 627, 752.1; 294/64.1
See application file for complete search history.

(56) References Cited

U.S. PATENT DOCUMENTS

| | | | | |
|---|---|---|---|---|
| 4,734,605 A | * | 3/1988 | Hayashi | 310/80 |
| RE33,780 E | * | 12/1991 | Itagaki et al. | 29/741 |
| 5,994,799 A | | 11/1999 | Mehdianpour | |
| 6,724,104 B2 | * | 4/2004 | Katsuki et al. | 310/12 |
| 6,851,914 B2 | * | 2/2005 | Hirata | 414/627 |
| 7,026,731 B2 | * | 4/2006 | Beakley | 310/12 |
| 7,226,270 B2 | * | 6/2007 | Hwang et al. | 414/749.1 |
| 7,239,050 B2 | * | 7/2007 | Miyamoto | 310/12 |
| 7,259,483 B2 | * | 8/2007 | Komiya et al. | 310/12 |
| 2002/0148109 A1 | | 10/2002 | Kashitani et al. | |
| 2005/0257638 A1 | * | 11/2005 | Komiya et al. | 74/490.01 |

FOREIGN PATENT DOCUMENTS

| | | |
|---|---|---|
| JP | 11-163599 A | 6/1999 |
| JP | 2001-069744 | 3/2001 |
| JP | 2001-169529 | * 6/2001 |
| JP | 2002-299892 | 10/2002 |
| JP | 2002/315297 | 10/2002 |
| JP | 2003/289693 | 10/2003 |
| WO | WO 02/067648 | 8/2002 |

OTHER PUBLICATIONS

Japanese Office Action for JP 2004-127842.
Japanese Office Action.

* cited by examiner

*Primary Examiner*—Minh Trinh
(74) *Attorney, Agent, or Firm*—Pearne & Gordon LLP (57) ABSTRACT

In a linear driving mechanism for electronic component mounting apparatus that performs mounting operation for mounting an electronic component on a substrate and linearly drives a transfer beam 8 in a Y direction using a linear motor, an object to be driven and the linear motor are disposed such that a position P of thrust generated by the linear motor for driving the transfer beam 8 in the Y direction approximately corresponds to a central position D1 of inertial resistance of the object to be driven comprising movable portions such as transfer beam 8, loading head 9, and transfer plate 12. Accordingly, twisting moment applied to the transfer beam 8 due to inertial force is eliminated in acceleration/deceleration, and loading position accuracy is ensured and a component life can be lengthened.

6 Claims, 6 Drawing Sheets

LINEAR DRIVING MECHANISM FOR ELECTRONIC COMPONENT MOUNTING APPARATUS

BACKGROUND OF THE INVENTION

The present invention relates to a linear driving mechanism which is arranged in electronic component mounting apparatus such as electronic component loading apparatus and linearly drives an object to be driven such as loading head.

In the electronic component mounting apparatus such as electronic component loading apparatus, the linear driving mechanism is generally used for a head transfer mechanism for transferring a working head such as loading head. Recently, a type of a linear driving mechanism using a linear motor for a linear motion is increasingly used for the linear driving mechanism, instead of a conventionally used linear driving mechanism of a ball-screw type in which a rotational motion by a motor is converted to the linear motion using a ball screw (for example, see JP-A-2002-299892.).

In the linear mechanism, thrust given by the linear motor is exerted on ends of a transfer beam equipped with the loading head. In the above example, the linear motors are disposed close and parallel to guide rails similarly as an arranged position of the ball screw in the conventional apparatus of the ball-screw drive type.

The linear driving mechanism using the linear motor are characterized by high-speed operation and high position accuracy, and the transfer beam driven by the linear motor performs highly accelerated start-and-stop actions at high frequency. Therefore, there have been the following problems in the linear driving mechanism having the configuration due to the fact that the arranged position of the linear motor is located near the guide rail.

When the transfer beam is driven by the linear motor, the position of the center of gravity of the transfer beam is an active position of inertial resistance in acceleration and deceleration. However, in the above-mentioned configuration, a position of thrust generated by the linear motor is significantly distant from a center of the inertial resistance of the transfer beam, and twisting moment is exerted on the transfer beam due to the inertial force in acceleration and deceleration. Therefore, the transfer beam is deformed due to the twist, which affects on accuracy of loading by the loading head, and the twisting moment is applied to a guide mechanism at high frequency, causing life shortening of guide mechanism components.

SUMMARY OF THE INVENTION

Therefore, the invention intends to provide a linear driving mechanism of electronic component mounting apparatus in which the loading position accuracy is ensured and a life of a mechanical component can be lengthened in the linear driving mechanism using the linear motor.

According to the invention, the linear driving mechanism for an electronic component mounting apparatus that performs mounting operation for mounting an electronic component on a substrate and linearly drives an object to be driven in a first direction, the linear driving mechanism comprises a guide section for guiding the object to be driven in the first direction and a linear motor for driving the object to be driven in the first direction, wherein the object to be driven and the linear motor are disposed such that the position of thrust generated by the linear motor approximately corresponds to a central position of inertial resistance of the object to be driven.

Further, according to the invention, the linear driving mechanism for the electronic component mounting apparatus that performs mounting operation for mounting an electronic component on a substrate and linearly drives an object to be driven in a first direction, the linear driving mechanism comprises a guide section for guiding the object to be driven in a first direction and a linear motor for driving the object to be driven in the first direction, wherein the object to be driven, linear motor, and guide section are disposed such that a position of thrust generated by the linear motor is located between a central position of inertial resistance of the object to be driven and a central position of sliding resistance of the guide section.

Thus, respective sections of the mechanism are disposed such that the position of thrust generated by the linear motor approximately corresponds to the central position of inertial resistance of the object to be driven, or is located between the central position of inertial resistance and the central position of sliding resistance of the guide section, thereby the twisting moment applied to the object to be driven due to the inertial force is eliminated in acceleration and deceleration, and the loading position accuracy is ensured and the component life can be lengthened.

DETAILED DESCRIPTION OF THE PREFRRED EMBODIMENTS

Figure 1:
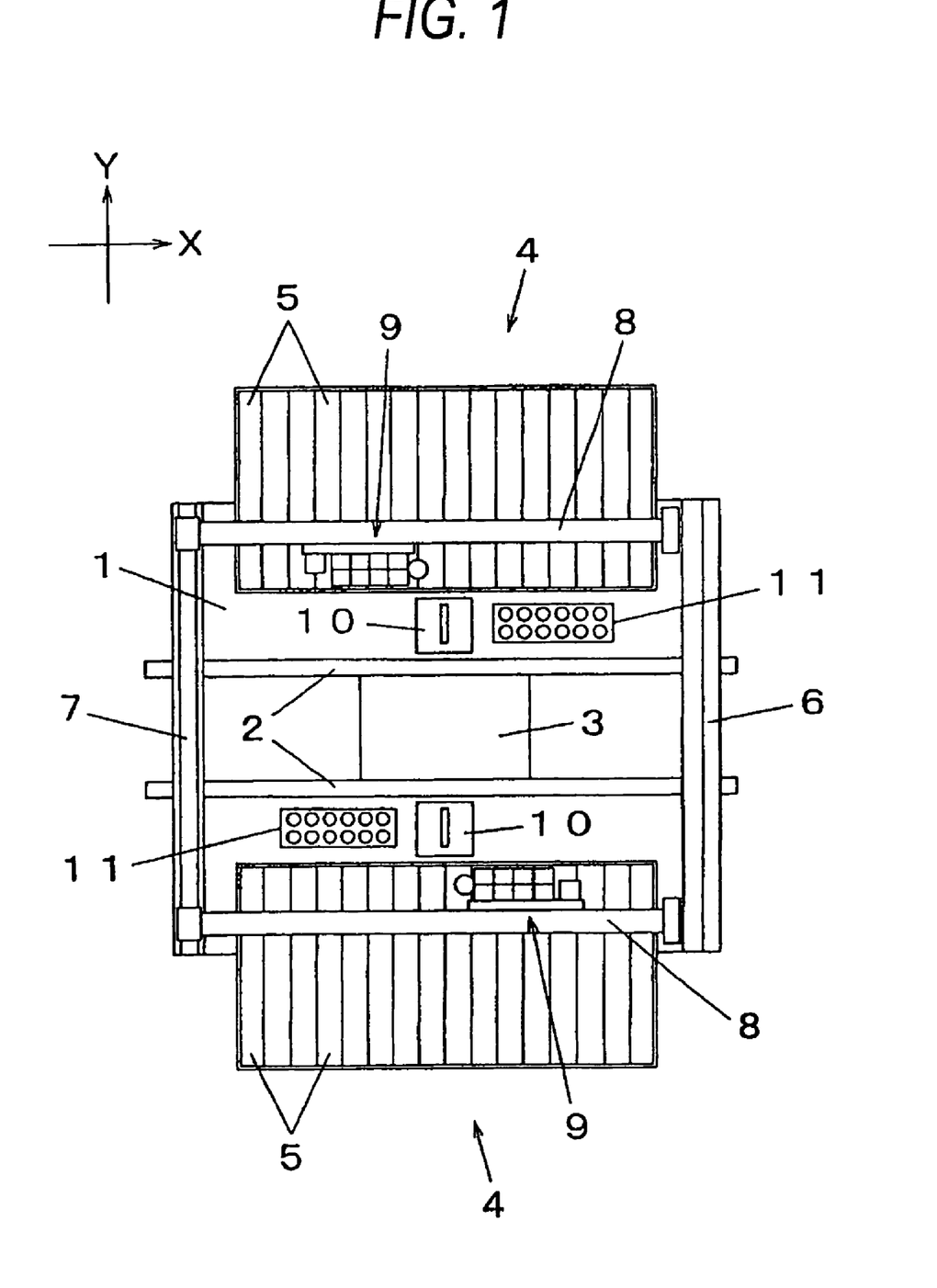
FIG. 1 is a plan view of electronic component loading apparatus of one embodiment of the invention.

Next, an embodiment of the invention is described with reference to drawings. First, a structure of the electronic component loading apparatus is described with reference to FIG. 1 and FIG. 2. The electronic component loading apparatus is an electronic component mounting apparatus that performs the mounting operation for mounting the electronic component on the substrate. In FIG. 1, a conveyance path 2 is arranged in an X direction on a base 1 of the electronic component loading apparatus. The conveyance path 2 conveys a substrate 3 on which the electronic component is mounted, and positions the substrate 3 in a mounting position set on the conveyance path 2. The conveyance path 2 is a substrate positioning section for conveying and positioning the substrate 3. On both sides of the conveyance path 2, component feeding sections 4 having a plural number of parts feeders 5 arranged parallel and a loading mechanism for picking out the electronic component from the component feeding sections 4 and loading it on the substrate 3 are arranged.

Figure 2:
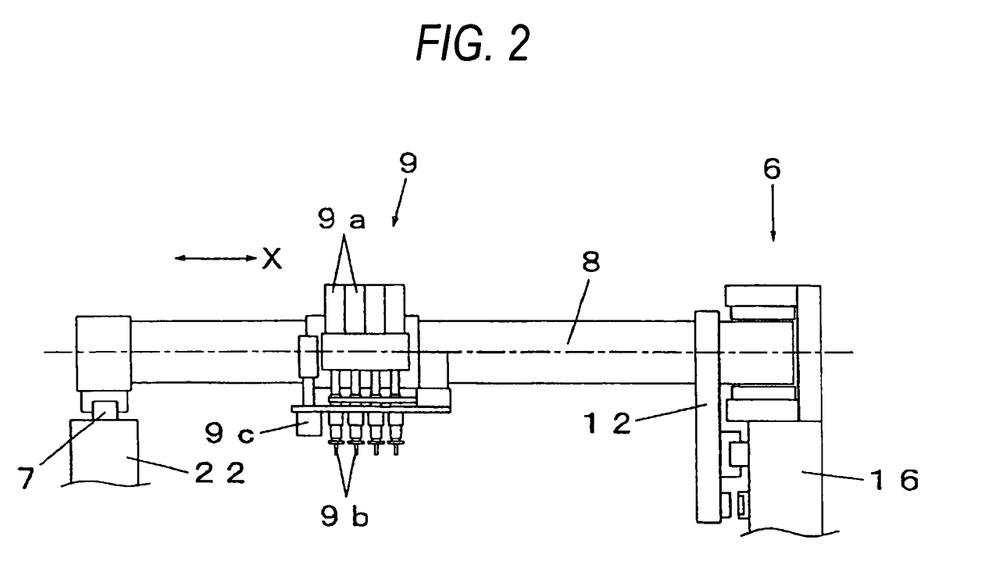
FIG. 2 is a cross section view of the electronic component loading apparatus of the one embodiment of the invention.

The loading mechanism is described. A Y linear driving mechanism 6 and a guide rail 7 are arranged in a Y direction on a right end and a left end of the base 1, respectively. As shown in FIG. 2, the Y linear driving mechanism 6 and the guide rail 7 are provided on frames 16 and 22 arranged on a top of the base 1 in the Y direction, respectively. The Y linear driving mechanism 6 is a linear driving mechanism driven by the linear motor as described later, and a transfer beam 8, of which the left end is guided by the guide rail 7, is transferred in the Y direction (first direction) by the linear driving mechanism. That is, the Y linear driving mechanism 6 linearly drives the transfer beam 8 as the object to be driven in the first direction using the linear motor. The transfer beam 8 incorporates an X linear driving mechanism which is also driven using the linear motor, and transfers a loading head 9 in a Y direction (second direction) using the X linear driving mechanism. The second direction is a direction perpendicular to the first direction.

As shown in FIG. 2, the loading head 9 is a multi-type loading head having a plural number of unit loading heads 9a, and sucks and holds the electronic component using an suction nozzle 9b provided in each unit loading head 9a. Moreover, the loading head 9 has a substrate identification camera 9c that is integrally transferred, and the substrate identification camera 9c is transferred onto the substrate 3 together with the loading head 9 and identifies a position thereof.

Figure 3:
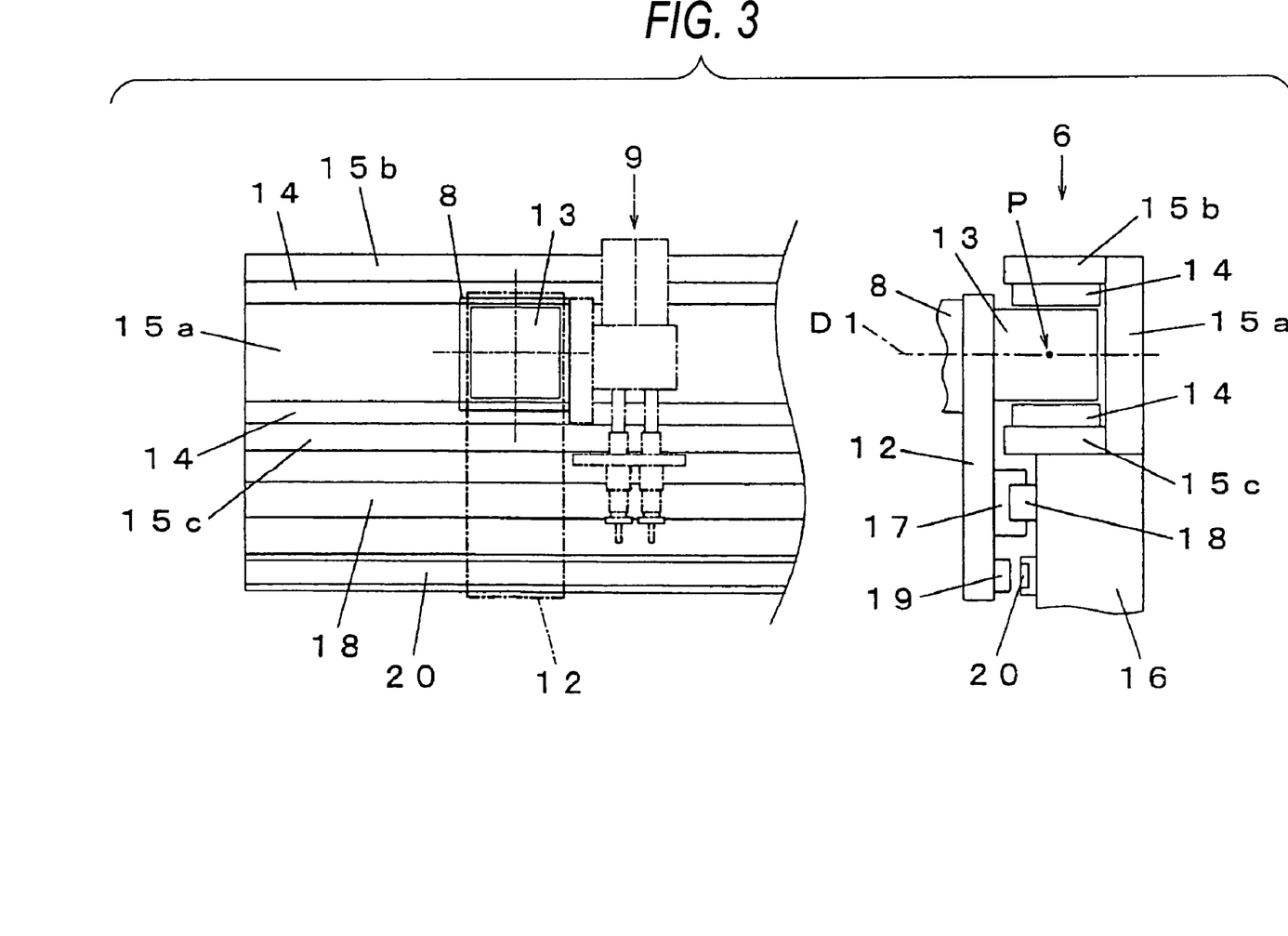
FIG. 3 and FIG. 4 are views for illustrating a structure of a Y linear driving mechanism of the electronic component loading apparatus of the one embodiment of the invention.

A configuration of a linear motor of the Y linear driving mechanism 6 is described with reference to FIG. 3. As shown in FIG. 3, three frame members 15a, 15b and 15c, which form a U shape, are arranged in the X direction on a top of the frame 16. At a bottom side of the frame 15b and on a top of the frame 15c, magnet members 14 in two rows, which form stators of the linear motor respectively, are arranged vertically in two rows that are opposed in a horizontal attitude along the Y direction.

A right end of the transfer beam 8 is coupled with a vertical transfer plate 12 as a drive transfer section, and, a mover 13, slider 7 and linear head 19 are fixed to an outer side of the transfer plate 12. On an inner side of the base frame 16, a guide rail 18 and a linear scale 20 are arranged in the Y direction respectively. The mover 13 is disposed between the opposed magnet members 14 in two rows, and the mover 1 transmits driving force in the Y direction to the transfer beam 8 via the transfer plate 12.

The slider 17 is fitted in the guide rail 18 slidably in the Y direction. The guide rail 18, slider 17 and transfer plate 12 form a guide section for guiding the transfer beam 8 as the object to be driven in the first direction. The linear head 19 is in a position opposed to the linear scale 20 with a certain interval, and when the transfer beam 8 is transferred, the linear head 19 is transferred along the linear scale 20, thereby a position signal in the Y direction is outputted.

Next, relation between the position of thrust generated by the linear motor and the central position of resistance of the object to be driven is described. Here, the object to be driven includes the transfer plate 12 and the loading head 9 transferred with the transfer beam 8, in addition to the transfer beam 8. In FIG. 3, a point P shown at a central portion of the mover 13 indicates the position of thrust generated by the linear motor (the center point of action of magnetic force exerted between the magnet members 14 in two rows and the mover 13).

D1 indicates a vertical position of the center of gravity of the object to be driven (transfer beam 8, transfer plate 12 and loading head 9), or the central position of inertial resistance in acceleration/deceleration, and in the example shown here, layout and weight distribution of respective sections are set such that the central position of inertial resistance D1 approximately corresponds to a central axis of the transfer beam 8.

In the example shown in FIG. 3, the object to be driven and the linear motor are disposed such that the position P of generated thrust approximately corresponds to the central position D1 of inertial resistance. That is, the vertical position of the mover 13 on the transfer plate 12 is set such that the vertically central position of the mover 13 approximately corresponds to the vertical position of the central axis of the transfer beam 8. Accordingly, the thrust given by the linear motor can be exerted on the central position of inertial resistance of the object to be driven in acceleration/deceleration of the linear motor.

Therefore, the problem in the conventional apparatus, or occurrence of twisting moment due to a fact that the position of thrust generated by the linear motor is significantly distant from the central position of inertial resistance of the transfer beam can be prevented. Accordingly, swing of the loading head due to the deformation of the transfer beam is prevented and thus the loading position accuracy can be ensured, and excessive load to the guide section is prevented and thus the component life can be lengthened.

When the transfer beam 8 is transferred, in addition to the inertial resistance in acceleration/deceleration, sliding resistance occurs due to sliding of the slider 17 along the guide rail 18. When the magnitude of the sliding resistance can not be neglected compared with the magnitude of inertial resistance, the position P of generated thrust is set in consideration of a position at which the sliding resistance is exerted and the magnitude of the sliding resistance, in addition to the central position of inertial resistance.

Figure 4:
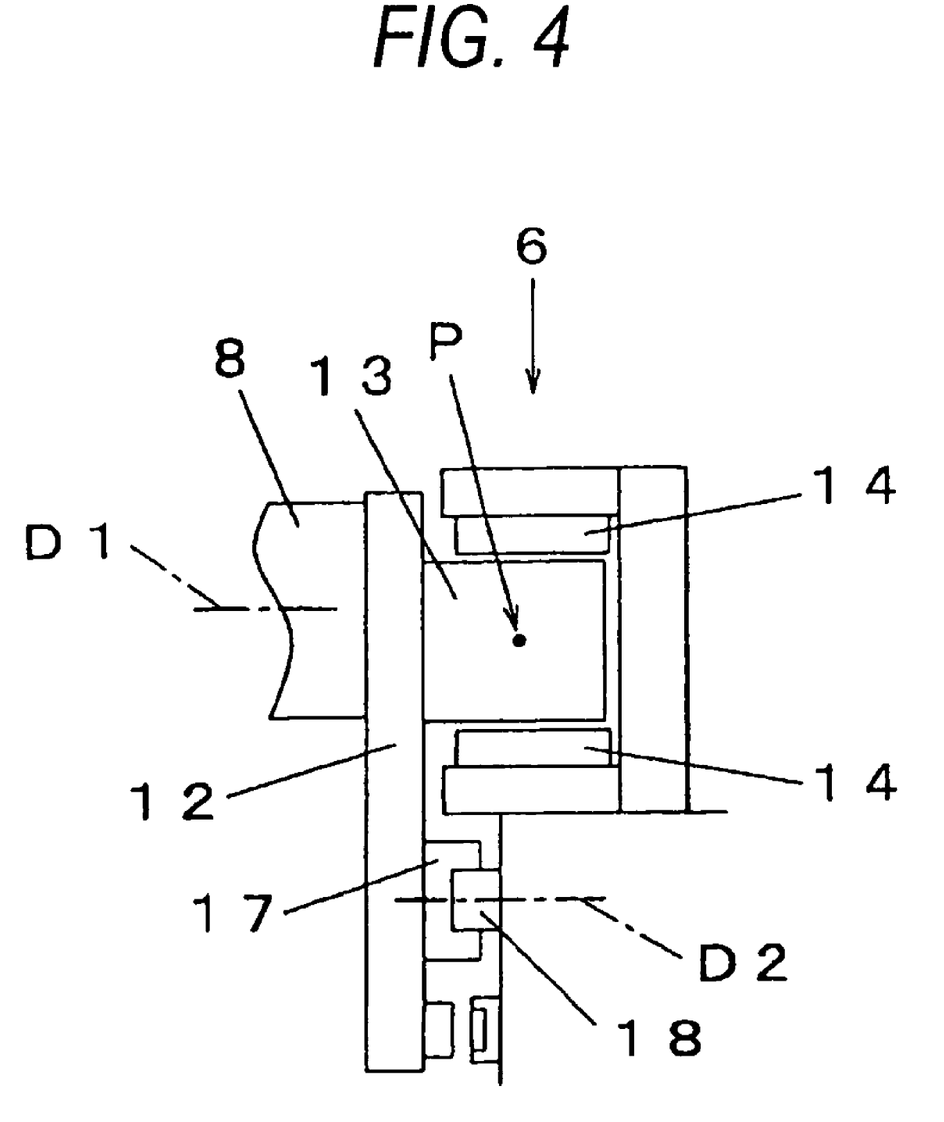

That is, as shown in FIG. 4, the object to be driven and linear motor and guide portion are disposed such that the position P of generated thrust approximately corresponds to a central position of the resultant resistance between the central position D1 of inertial resistance of the object to be driven and a central position D2 of sliding resistance caused by sliding of the guide portion (slider 17 and guide rail 18). Regarding the magnitude of the sliding resistance, an approximate value can be obtained from measurement, and the value of sliding resistance is combined with a value of inertial resistance that is computable from mass of the object to be driven and acceleration, thereby the central position of the resultant resistance can be estimated. The position P of generated thrust is set in such a manner, thereby more stable operation can be realized in acceleration/deceleration at high speed.

Figure 5:
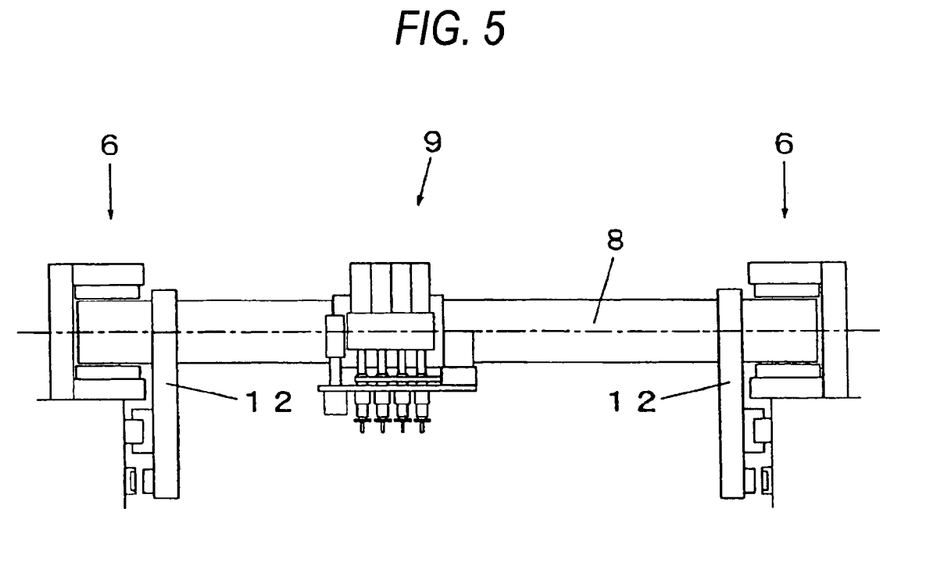
FIG. 5 and FIG. 6 are cross section views of the electronic component loading apparatus of the one embodiment of the invention.
Figure 6:
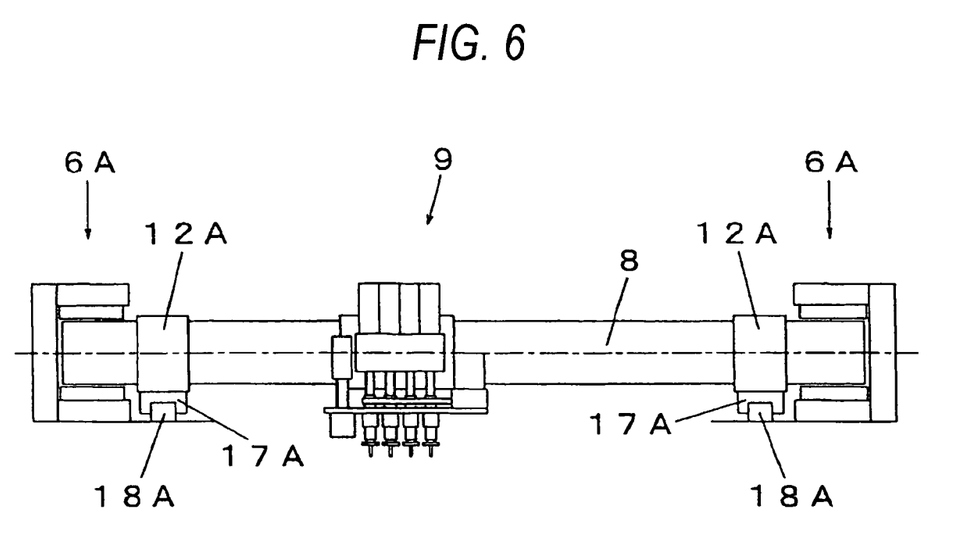

FIG. 5 and FIG. 6 show examples where such setting of the position of generated thrust is applied to transfer bears having different configurations from the embodiment. That is, the example shown in FIG. 5 shows an example where the Y linear driving mechanisms 6 are arranged on both sides of the transfer beam 8 instead of the Y linear driving mechanism 6 arranged on only one side of the transfer beam 6 in FIG. 2.

FIG. 6 shows an example where a block-like transfer block 12A is used as the drive transfer section for transferring the thrust given by the linear motor to the transfer beam 8, instead of the vertical transfer plate 12 shown in FIG. 2. In the example, both of a slider 17A fixed to a bottom of a transfer block 12A and a guide rail 18A arranged on a horizontal plane form the guide section for guiding the object to be driven in the Y direction.

Although an example of the electronic component loading apparatus for loading the electronic component on the substrate has been shown as the electronic component mounting apparatus in the embodiment, the invention can be applied to mounting apparatus forming an electronic component mounting line such as screen printing apparatus.

This application is based upon and claims the benefit of priority of Japanese Patent Application No. 2004-127842 filed on Apr. 23, 2004, the contents of which are incorporated herein by reference in its entirety.

The linear driving mechanism in the electronic component loading apparatus of the invention has advantages that the twisting moment applied to the object to be driven due to the inertial force in acceleration/deceleration is eliminated, and the loading position accuracy can be ensured and the component life can be lengthened, and is useful for the linear driving mechanism which is arranged in the electronic component mounting apparatus such as electronic component loading apparatus and linearly drives the object to be driven such as loading head.

What is claimed is:

1. A linear driving mechanism for an electronic component mounting apparatus that performs mounting operation for mounting an electronic component on a substrate and linearly drives an object to be driven in a first direction, the linear driving mechanism comprising:

a guide section for guiding the object to be driven in the first direction;

a linear motor for driving the object to be driven in the first direction; and a base frame connectively attached to the linear motor and extending along the guide section in the first direction, wherein the object to be driven and the linear motor are disposed on the guide section such that a thrust-generating point of the linear motor is approximately located at an inertial resistance center position of the object to be driven, wherein the linear driving mechanism further comprises a linear scale and a linear head, the linear scale is fixedly arranged on an inner side of the base frame in the first direction, and the linear head outputs a position signal in the first direction and is arranged on the object to be driven, wherein the linear scale and the linear head are opposed to each other, and the linear head is moved with respect to the linear scale which is fixedly arranged.

2. The linear driving mechanism according to claim 1, wherein the linear motor has stators arranged vertically in two rows that are opposed in a horizontal attitude along the first direction and a mover disposed between the stators in two rows, and the mover transfers driving force in the first direction to the object to be driven via a drive transfer section provided on a side end-face of the object to be driven.

3. The linear driving mechanism according to claim 1, wherein the object to be driven is a transfer beam incorporating a linear driving mechanism that transfers a loading head for adsorbing and holding the electronic component in a second direction perpendicular to the first direction.

4. A linear driving mechanism for electronic component mounting apparatus that performs mounting operation for mounting an electronic component on a substrate and linearly drives an object to be driven in a first direction, the linear driving mechanism comprising:

a guide section for guiding the object to be driven in the first direction;

a linear motor for driving the object to be driven in the first direction; and a base frame connectively attached to the linear motor and extending along the guide section in the first direction, wherein the object to be driven and the linear motor, are disposed on the guide section such that a thrust-generating point of the linear motor is located between an inertial resistance center position of the object to be driven and a sliding resistance center position of the guide section, wherein the linear driving mechanism further comprises a linear scale and a linear head, the linear scale is fixedly arranged on an inner side of the base frame in the first direction, and the linear head outputs a position signal in the first direction and is arranged on the object to be driven, wherein the linear scale and the linear head are opposed to each other, and the linear head is moved with respect to the linear scale which is fixedly arranged.

5. The linear driving mechanism according to claim 4, wherein the linear motor has stators arranged vertically in two rows that are opposed in a horizontal attitude along the first direction and a mover disposed between the stators in two rows, and the mover transfers driving force in the first direction to the object to be driven via a drive transfer section provided on a side end-face of the object to be driven.

6. The linear driving mechanism according to claim 4, wherein the object to be driven is a transfer beam incorporating a linear driving mechanism that transfers a loading head for adsorbing and holding the electronic component in a second direction perpendicular to the first direction.

* * * * *

UNITED STATES PATENT AND TRADEMARK OFFICE
CERTIFICATE OF CORRECTION

PATENT NO. : 7,578,054 B2 Page 1 of 1
APPLICATION NO. : 11/112773
DATED : August 25, 2009
INVENTOR(S) : Komiya et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 554 days.

Signed and Sealed this

Seventh Day of September, 2010

David J. Kappos
*Director of the United States Patent and Trademark Office*